United States Patent
Yang et al.

(10) Patent No.: US 11,460,741 B2
(45) Date of Patent: Oct. 4, 2022

(54) TRANSISTOR SUBSTRATE AND DISPLAY DEVICE MANUFACTURED FROM THE TRANSISTOR SUBSTRATE

(71) Applicant: InnoLux Corporation, Miao-Li County (TW)

(72) Inventors: Yung-Shun Yang, Miao-Li County (TW); Chun-Liang Lin, Miao-Li County (TW); Yi-Ching Chen, Miao-Li County (TW); Nai-Fang Hsu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 17/133,936

(22) Filed: Dec. 24, 2020

(65) Prior Publication Data

US 2021/0149263 A1     May 20, 2021

Related U.S. Application Data

(63) Continuation of application No. 15/498,551, filed on Apr. 27, 2017, now abandoned.

(30) Foreign Application Priority Data

Apr. 28, 2016  (TW) .................. 105113233

(51) Int. Cl.
*G02F 1/1362*   (2006.01)
*G02F 1/1368*   (2006.01)
(Continued)

(52) U.S. Cl.
CPC ...... *G02F 1/136286* (2013.01); *G02F 1/1368* (2013.01); *G02F 1/133512* (2013.01);
(Continued)

(58) Field of Classification Search
CPC ......... G02F 1/134363; G02F 1/134372; G02F 1/133512
See application file for complete search history.

(56) References Cited

U.S. PATENT DOCUMENTS 5,847,792 A * 12/1998 Kobayashi ........ G02F 1/136209
349/110
8,427,617 B2 * 4/2013 Tanaka .............. G02F 1/133512
349/141

(Continued)

*Primary Examiner* — Alexander P Gross
(74) *Attorney, Agent, or Firm* — McClure, Qualey & Rodack, LLP (57) ABSTRACT

A transistor substrate is provided. The transistor substrate includes a plurality of data lines and a plurality of scan lines, wherein the scan lines intersects with the data lines to define a plurality of pixel units. One of the pixel units includes a first electrode having a slit substantially parallel to the data lines. The pixel units include a second electrode and a switching transistor. The switching transistor includes a gate electrode connecting to one of the scan lines. The gate electrode has a first edge substantially parallel to the extending direction of the scan lines. The switching transistor includes a drain electrode electrically connected to one of the first electrode and the second electrode. The drain electrode includes an extending portion which extends toward the slit and extends away from an extending line of the first edge. The drain electrode and the slit have an overlapping region.

11 Claims, 9 Drawing Sheets

(51) Int. Cl.
*G02F 1/1343* (2006.01)
*G02F 1/1335* (2006.01)
*G02F 1/1337* (2006.01)
*H01L 27/12* (2006.01)

(52) U.S. Cl.
CPC .. *G02F 1/134309* (2013.01); *G02F 1/133514* (2013.01); *G02F 1/133707* (2013.01); *G02F 1/134372* (2021.01); *G02F 2201/40* (2013.01); *H01L 27/124* (2013.01)

(56) References Cited

U.S. PATENT DOCUMENTS

| | | | |
|---|---|---|---|
| 2002/0109141 A1* | 8/2002 | Kim | H01L 29/4908 257/59 |
| 2007/0225096 A1* | 9/2007 | Fujita | G02F 1/134363 474/202 |
| 2008/0297678 A1* | 12/2008 | Lee | G02F 1/136209 349/44 |
| 2009/0322995 A1* | 12/2009 | Yonemura | G02F 1/134363 349/96 |
| 2014/0063429 A1* | 3/2014 | Huh | G02F 1/133707 349/139 |
| 2015/0146143 A1* | 5/2015 | Kim | G02F 1/136209 349/104 |
| 2015/0160498 A1* | 6/2015 | Zhang | G02F 1/134309 428/136 |
| 2017/0123282 A1* | 5/2017 | Tsuruma | G02F 1/134363 |

* cited by examiner

TRANSISTOR SUBSTRATE AND DISPLAY DEVICE MANUFACTURED FROM THE TRANSISTOR SUBSTRATE

CROSS REFERENCE TO RELATED APPLICATIONS

This application is a Continuation of pending U.S. patent application Ser. No. 15/498,551, filed on Apr. 27, 2017, which claims priority of Taiwan Patent Application No. 105113233, filed on Apr. 28, 2016, the entirety of which are incorporated by reference herein.

BACKGROUND

Technical Field

The disclosure relates to a transistor substrate and a display device manufactured from the transistor substrate. The disclosure in particular relates to a transistor substrate including an electrode having a slit and a display device manufactured from the transistor substrate.

Description of the Related Art

Display devices have been widely used in the display components of a variety of products. Liquid-crystal displays (LCDs) utilize the properties of liquid-crystal molecules, which have different polarization or reflection effects to lights under different arrangement states, so as to control the amounts of the transmitting lights. These liquid-crystal displays thus create images. The traditional twisted nematic (TN) liquid-crystal displays have outstanding transmission properties, but the visual angles thereof are quite narrow due to the structural and optical features of the liquid-crystal molecules.

To solve this problem, manufacturers have recently developed various wide-view liquid-crystal display devices, such as fringe-field switching (FFS) liquid-crystal displays, in-plane switching (IPS) liquid-crystal displays, and so on.

However, existing display devices have not been satisfactory in every respect. Therefore, a display device which may further improve the aperture ratio or the contrast ratio is needed.

SUMMARY

The present disclosure provides a transistor substrate, including a plurality of data lines and a plurality of scan lines intersecting with the plurality of data lines to define a plurality of pixel units. One of the pixel units includes a first electrode, a second electrode, and a switching transistor. The first electrode has a slit that is substantially parallel to the data lines. One of the first electrode and the second electrode is used for receiving a pixel voltage signal, and the other of the first electrode and the second electrode is used for receiving a common voltage signal. The switching transistor includes a gate electrode and a drain electrode. The gate electrode is connected to one of the scan lines and includes a first edge that is substantially parallel to the extending direction of the scan lines. The drain electrode is electrically connected to either the first electrode or the second electrode. The drain electrode includes an extending portion, wherein the extending portion extends toward the slit and extends away from an extending line of the first edge. The drain electrode and the slit have an overlapping region.

The present disclosure also provides a display device, including: a transistor substrate as described above; an opposing substrate disposed opposite to the transistor substrate; and a display medium disposed between the transistor substrate and the opposing substrate.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

The transistor substrate of the present disclosure and the display device manufactured from the transistor substrate are described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

It should be noted that the elements or devices in the drawings of the present disclosure may be present in any form or configuration known to those with ordinary skill in the art. In addition, the expressions "a layer overlying another layer", "a layer is disposed above another layer", "a layer is disposed on another layer" and "a layer is disposed over another layer" may indicate that the layer is in direct contact with the other layer, or that the layer is not in direct contact with the other layer, there being one or more intermediate layers disposed between the layer and the other layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

The terms "about" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another region, layer or section. Thus, a first element, component, region, layer, portion or section discussed below could be termed a second element, component, region, layer, portion or section without departing from the teachings of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

This description of the exemplary embodiments is intended to be read in connection with the accompanying drawings, which are to be considered part of the entire written description. The drawings are not drawn to scale. In addition, structures and devices are shown schematically in order to simplify the drawing.

In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

The term "substrate" is meant to include devices formed within a transparent substrate and the layers overlying the transparent substrate. All transistor element needed may already be formed over the substrate. However, the substrate is represented with a flat surface in order to simplify the drawing. The term "substrate surface" is meant to include the uppermost exposed layers on a transparent substrate, such as an insulating layer and/or metallurgy lines.

In accordance with the embodiments of the present disclosure, the drain electrode overlaps with the end portion of the slit of the pixel electrode or the common electrode so as to shield light leaks of the end portion, which in turn improves the aperture ratio or the contrast rate of the display device.

Figure 1:
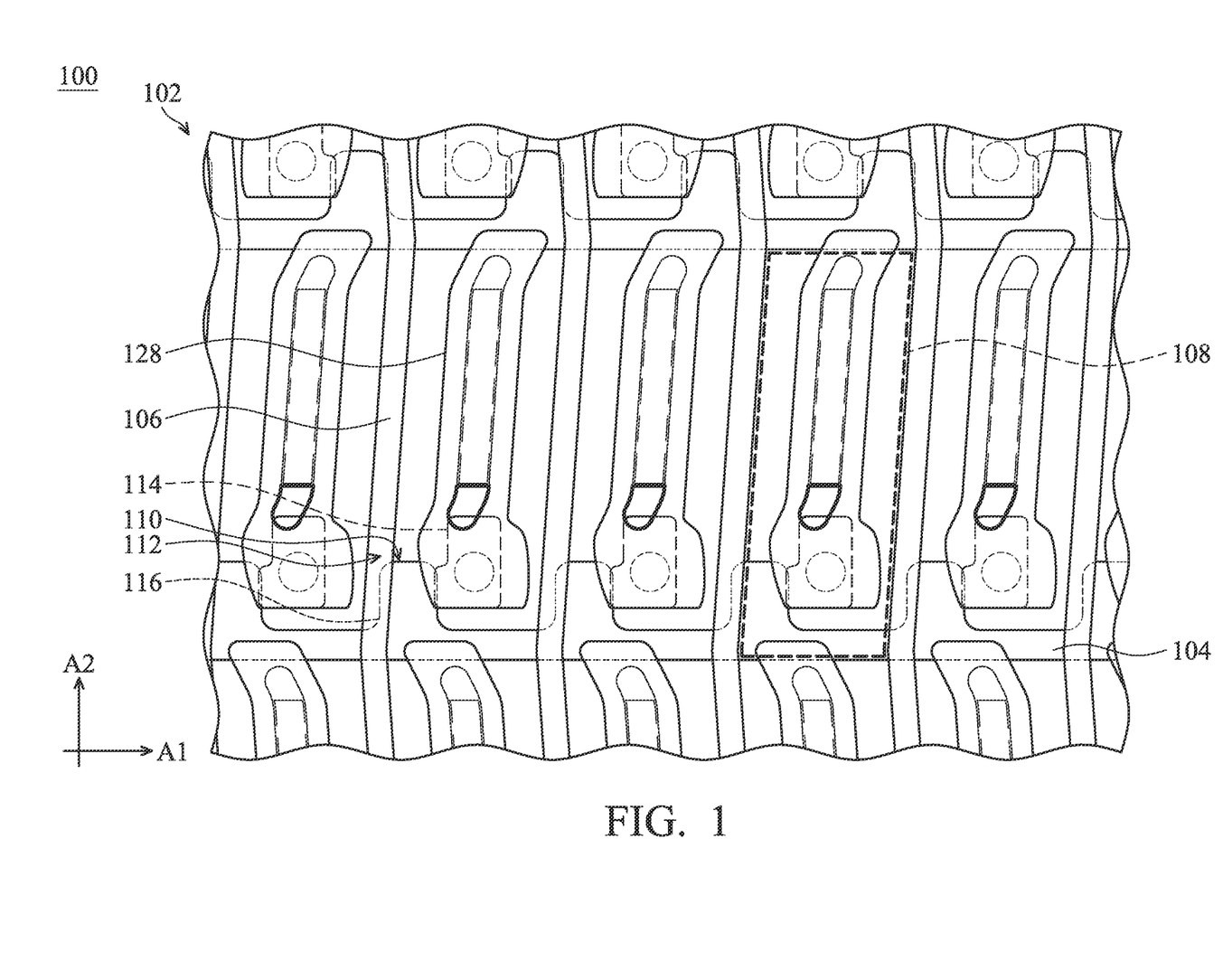
FIG. 1 is a top view of the transistor substrate of the display device in accordance with some embodiments of the present disclosure.
Figure 2A:
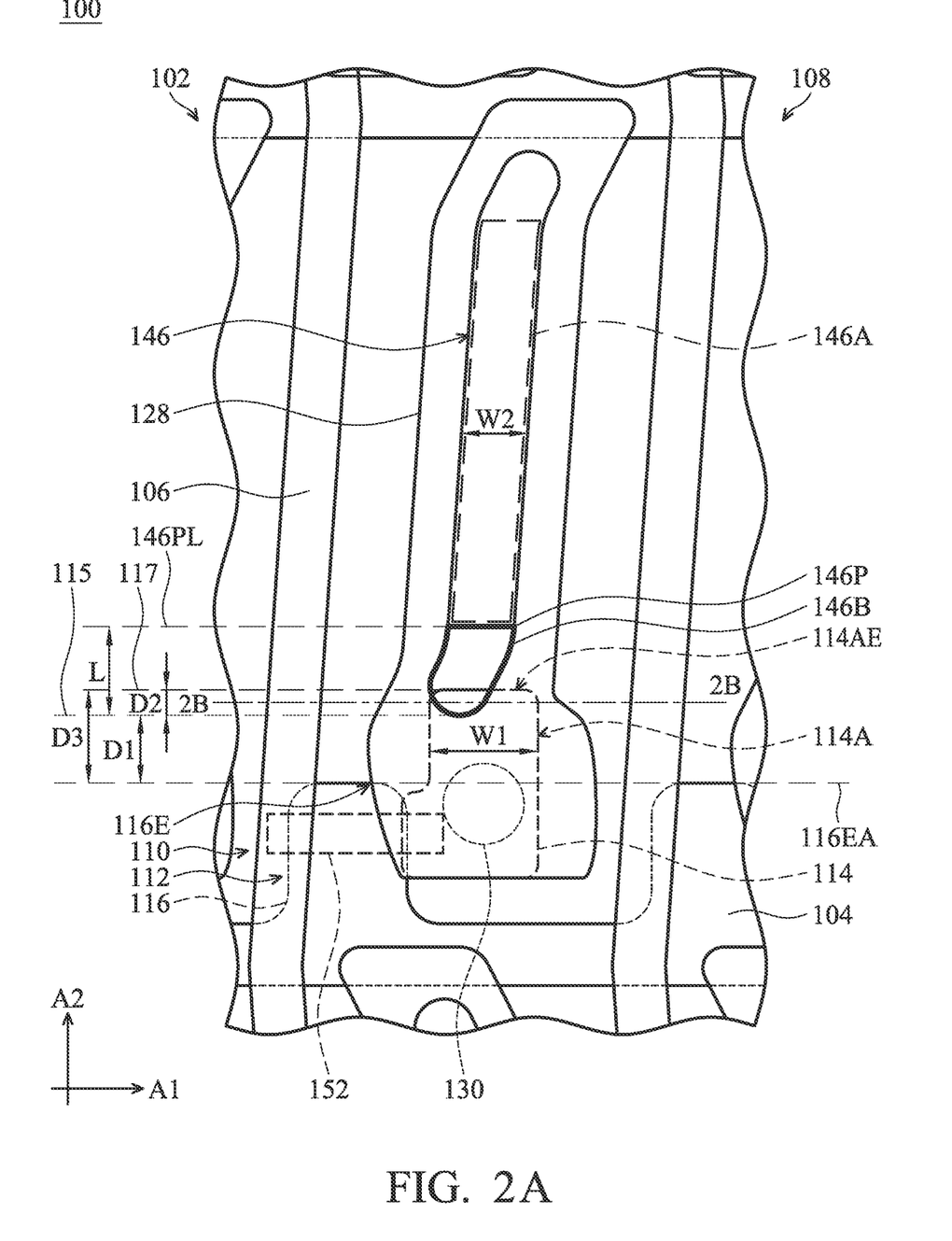
FIG. 2A is a partially enlarged figure of the transistor substrate of the display device in FIG. 1.

FIG. 1 is a top view of a transistor substrate 102 of a display device 100 in accordance with some embodiments of the present disclosure. FIG. 2A is a partially enlarged figure of one of the pixel units of the transistor substrate 102 of the display device 100 in FIG. 1. As shown in FIGS. 1 and 2A, the transistor substrate 102 may include a plurality of scan lines (gate lines) 104 extending along a first direction A1 and a plurality of data lines 106 intersecting the scan lines 104. The scan lines 104 extend along direction A1, and data lines 106 are substantially perpendicular or orthogonal to the scan-lines and extend along a second direction A2.

In addition, the plurality of scan lines 104 and the plurality of data lines 106 intersect each other to define a plurality of pixel units 108, such as sub-pixels. One of the pixel units 108 includes a switching transistor 110.

The data lines 106 may provide a signal to the pixel units 108 through the switching transistor 110. The scan lines (gate lines) 104 may provide the scanning pulse signal to the pixel units 108 through the switching transistor 110 and control the pixel units 108 in coordination with the aforementioned signal.

The switching transistor 110 includes a semiconductor layer 152, a source electrode 112, a drain electrode 114 and a gate electrode 116. The gate electrode 116 is connected to one of the scan lines 104 and extends from the scan line 104 along the second direction A2. The source electrode 112 is a portion of the data line 106.

Figure 2B:
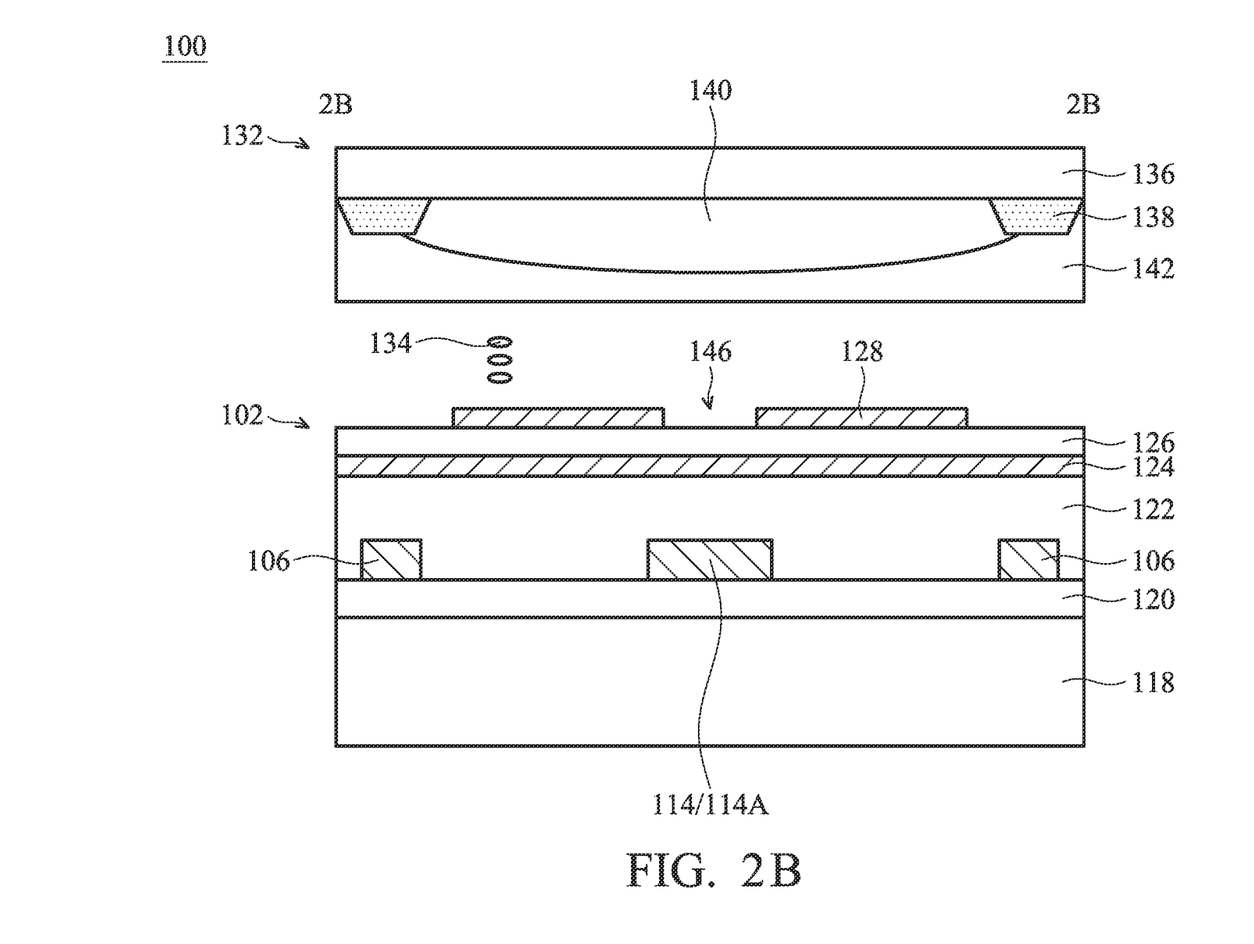
FIG. 2B is a cross-sectional view along line 2B-2B in FIG. 2A in accordance with some embodiments of the present disclosure.

FIG. 2B is a cross-sectional view along line 2B-2B in FIG. 2A in accordance with some embodiments of the present disclosure. As shown in FIG. 2B, the transistor substrate 102 may include a substrate 118. The substrate 118 may include, but is not limited to, a transparent substrate, such as a glass substrate, a ceramic substrate, a plastic substrate, or any other suitable transparent substrate. The above-mentioned data lines 106, the source electrode 112 and the drain electrode 114 are disposed on the substrate 118. In addition, the insulating layer 120 is disposed between the data lines 106 and the substrate 118, between the source electrode 112 and the substrate 118, and between the drain electrode 114 and the substrate 118. The insulating layer 120 is illustrated as one layer for simplicity. In practical processes, the insulating layer 120 may include more than a single layer. For example, the insulating layer 120 may include a gate dielectric layer and a buffer layer.

The materials of the gate electrode 116 and gate line 104 may include one or more types of metal, metal nitride, conductive metal oxide, or a combination thereof. The metal may include, but is not limited to, molybdenum, tungsten, titanium, tantalum, platinum, or hafnium. The metal nitride may include, but is not limited to, molybdenum nitride, tungsten nitride, titanium nitride or tantalum nitride. The conductive metal oxide may include, but is not limited to, ruthenium oxide or indium tin oxide. The gate electrode 116 and gate line 104 may be formed by the chemical vapor deposition (CVD), sputtering, resistive thermal evaporation, electron beam evaporation, or any other suitable methods.

The material of the gate dielectric layer 120 may include silicon oxide, silicon nitride, silicon oxynitride, high-k dielectric material, any other suitable dielectric material, or a combination thereof. The high-k dielectric material may include, but is not limited to, metal oxide, metal nitride, metal silicide, transition metal oxide, transition metal nitride, transition metal silicide, metal oxynitride, metal aluminate, zirconium silicate, zirconium aluminate. For example, the material of the high-k dielectric material may include, but is not limited to, LaO, AlO, ZrO, TiO, $Ta_2O_5$, $Y_2O_3$, $SrTiO_3$(STO), $BaTiO_3$(BTO), BaZrO, $HfO_2$, $HfO_3$, HfZrO, HfLaO, HfSiO, HfSiON, LaSiO, AlSiO, HfTaO, HfTiO, HfTaTiO, HfAlON, $(Ba,Sr)TiO_3$(BST), $Al_2O_3$, any other suitable high-k dielectric material, or a combination thereof. The gate dielectric layer 120 may be formed by chemical vapor deposition or spin-on coating. The chemical vapor deposition may include, but is not limited to, low pressure chemical vapor deposition (LPCVD), low temperature chemical vapor deposition (LTCVD), rapid thermal chemical vapor deposition (RTCVD), plasma enhanced chemical vapor deposition (PECVD), atomic layer deposition (ALD), or any other suitable method.

Still referring to FIG. 2B, the data line 106 (including the source electrode 112) and the drain electrode 114 are disposed on the insulating layer 120. The materials of the data line 106 (including the source electrode 112) and the drain electrode 114 may include, but is not limited to, copper, aluminum, molybdenum, tungsten, gold, cobalt, nickel, platinum, titanium, iridium, rhodium, an alloy thereof, a combination thereof, or any other conductive material. In other embodiments, the data line 106 (including the source electrode 112) and the drain electrode 114 may include a nonmetal material as long as the material is conductive. The material of the data line 106 (including the source electrode 112) and the drain electrode 114 may be formed by chemical vapor deposition (CVD), sputtering, resistive thermal evaporation, electron beam evaporation, or any other suitable method. In some embodiments, the materials of the data line 106 (including the source electrode 112) and the drain electrode 114 may be the same, and the data line 106 (including the source electrode 112) and the drain electrode 114 may be formed in the same deposition step. However, in other embodiments, the data line 106 (including the source electrode 112) and the drain electrode 114 may be formed in different deposition steps, and the materials of the data line 106 (including the source electrode 112) and the drain electrode 114 may be different from each other.

Still referring to FIG. 2B, the transistor substrate 102 may further include a first insulating layer 122, which covers the data lines 106 (including the source electrode 112), the drain electrode 114 and the gate dielectric layer 120. The material of the first insulating layer 122 may include an organic material or an inorganic material such as silicon nitride, silicon oxide, or silicon oxynitride. The first insulating layer 122 may be formed by chemical vapor deposition (CVD) or spin-on coating. The chemical vapor deposition may include, but is not limited to, low pressure chemical vapor deposition (LPCVD), low temperature chemical vapor deposition (LTCVD), rapid thermal chemical vapor deposition (RTCVD), plasma enhanced chemical vapor deposition (PECVD), atomic layer deposition (ALD), or any other suitable method.

Moreover, in other embodiments, the material of the first insulating layer 122 may include the combinations of the organic insulating materials or the inorganic insulating materials.

Still referring to FIG. 2B, the transistor substrate 102 may further include a common electrode 124 disposed on the first insulating layer 122. The common electrode 124 is used for receiving a common voltage signal.

Still referring to FIG. 2B, the transistor substrate 102 may further include a second insulating layer 126 covering the common electrode 124. The second insulating layer 126 may include, but is not limited to, silicon nitride, silicon oxide, or silicon oxynitride.

Still referring to FIG. 2B, the transistor substrate 102 may further include a pixel electrode 128 disposed on the second insulating layer 126. The pixel electrode 128 is used for receiving a pixel voltage signal. The common electrode 124 can be disposed corresponding to the pixel electrode 128. In addition, the pixel electrode 128 is electrically connected to the drain electrode 114 of the switching transistor 110 through an opening 130 as shown in FIG. 2A. Thus, the pixel electrode 128 can receive the pixel voltage signal via the drain electrode 114. The drain electrode 114 can be electrically connected to one of the plurality of data lines 106.

Moreover, still referring to FIG. 2B, the display device 100 may further include an opposing substrate 132 disposed opposite to the transistor substrate 102, and a display medium 134 disposed between the transistor substrate 102 and the opposing substrate 132.

The display device 100 may be, but is not limited to, a touch liquid-crystal display such as a thin film transistor liquid-crystal display. The liquid-crystal display may include, but is not limited to, a twisted nematic (TN) liquid-crystal display, a super twisted nematic (STN) liquid-crystal display, a double layer super twisted nematic (DSTN) liquid-crystal display, a vertical alignment (VA) liquid-crystal display, an in-plane switching (IPS) liquid-crystal display, a cholesteric liquid-crystal display, a blue phase liquid-crystal display, a fringe-field switching (FFS) liquid-crystal display, or any other suitable liquid-crystal display.

In some embodiments, the opposing substrate 132 serves as a color filter substrate. In particular, the opposing substrate 132, which serves as a color filter substrate, may include a substrate 136, a light-shielding layer 138 disposed over the substrate 136, a color filter layer 140 disposed over the light-shielding layer 138 and the substrate 136, and a overcoat layer 142 covering the light-shielding layer 138 and the color filter layer 140.

The substrate 136 may be a transparent substrate such as a glass substrate, a ceramic substrate, a plastic substrate, or any other suitable transparent substrate. The light-shielding layer 138 may be, but is not limited to, black photoresist, black printing ink, or black resin. The color filter layer 140 may include a red color filter layer, a green color filter layer, a blue color filter layer, or any other suitable color filter layer.

Figure 2C:
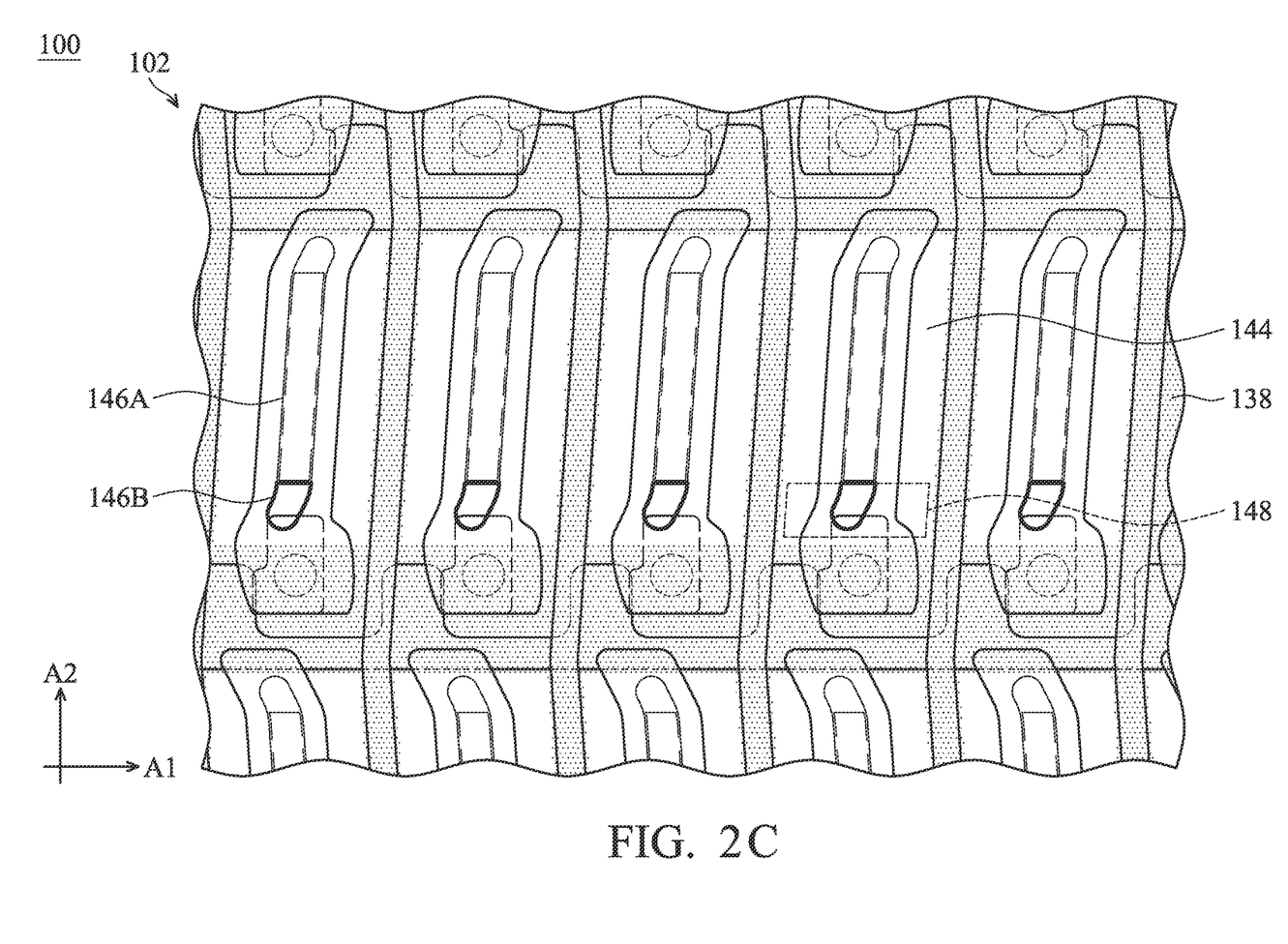
FIG. 2C is a top view of the transistor substrate of the display device in accordance with some embodiments of the present disclosure.

FIG. 2C is a top view of the transistor substrate 102 of the display device 100 in accordance with some embodiments of the present disclosure, which shows the same transistor substrate 102 and the same light-shielding layer 138 of the opposing substrate as in FIG. 1. In some embodiments, as shown in FIG. 2C, the light-shielding layer 138 defines a pixel aperture region 144. In other words, the region of the transistor substrate 102 that is not shielded by the light-shielding layer 138 is the pixel aperture region 144, and the region of the transistor substrate 102 that corresponds to the light-shielding layer 138 of the opposing substrate 132 is the light-shielding region.

Referring to FIG. 2A, showing two adjacent scan lines 104 and two adjacent data lines 106 to define a pixel unit 128, the pixel electrode 128 has a slit 146, and the slit 146 is substantially parallel to the data line 106. In addition, the gate electrode 116 includes a first edge 116E. The first edge 116E is substantially parallel to the extending direction A1 of the scan line 104, and is the edge of the gate electrode 116 which is farthest from the corresponding scan line 104. The first edge 116E is adjacent to the slit 146. Moreover, the drain electrode 114 includes an extending portion 114A. The extending portion 114A extends toward the slit 146 and extends away from an extending line 116EA of the first edge 116E. The drain electrode 114 and the slit 146 have an overlapping region. In some embodiments, the extending portion 114A of the drain electrode 114 at least partially overlaps the slit 146 of the pixel electrode 128.

In particular, the slit 146 includes a major axis portion 146A and a curved portion 146B (or is referred to as an end portion 146B) connected to the major axis portion 146A. Using the extending direction A1 of the scan line 104 as a basis, the slope of the edge of the major axis portion 146A is different from the slope of the edge of the curved portion 146B. For example, in accordance with some embodiments of the present disclosure, the edge of the major axis portion 146A is substantially parallel to the data line 106, and the edge of the curved portion 146B is substantially not parallel to the data line 106.

Furthermore, in accordance with some embodiments of the present disclosure, the point of the edge of the slit 146 where the slope thereof starts to be different from the slope of the edge of the data line 106 is point 146P. The line crossing through point 146P and parallel to the extending direction A1 of the scan line 104 is line 146PL. Line 146PL is the boundary between the major axis portion 146A and the curved portion 146B. The overlapping region between the extending portion 114A of the drain electrode 114 and the slit 146 is located within the curved portion 146B.

In the display device 100, light leaks may occur in the region corresponding to the curved portion 146B of the slit 146. In traditional display devices, a light-shielding layer is used for shielding light leaks in such portions. However, the light-shielding layer used in a traditional display device also shields regions other than the above curved portion of the slit. For example, the light-shielding layer may shield the whole region 148 including the curved portion 146B (as shown in FIG. 2C). By comparison, in the embodiments of the present disclosure, the extending portion 114A of the drain electrode 114 merely shields the curved portion 146B of the slit and does not shield other regions such as regions other than the curved portion 146B in the above region 148. Therefore, the embodiments of the present disclosure may improve the aperture ratio of the display device.

In addition, in accordance with some embodiments of the present disclosure, as shown in FIG. 2C, a portion of the extending portion 114A of the drain electrode 114 is located within the pixel aperture region 144.

Next, referring to FIG. 2A, in accordance with some embodiments of the present disclosure, the length L of the curved portion 146B along direction A2 is from 2 μm to 4 μm, in which direction A2 is perpendicular to the extending direction A1 of the scan line 104.

Furthermore, in accordance with some embodiments of the present disclosure, the distance D1 between the end of the curved portion 146B and the first edge 116E of the gate electrode 116 along direction A2 is from 3 μm to 5 μm, in which direction A2 is perpendicular to the extending direction A1 of the scan line 104. The end of the curved portion 146B is the point in the curved portion 146B which is nearest to the gate electrode 116 or the scan line 104 along direction A2.

In other words, line 115 is the line crossing through the end of the curved portion 146B and parallel to direction A1. The distance D1 is the distance from line 115 to the extending line 116EA of the first edge 116E along direction A2.

Moreover, the extending portion 114A includes a second edge 114AE. The second edge 114AE is substantially parallel to the first edge 116E and is the edge of the extending portion 114A which is farthest from the gate electrode 116 or the scan line 104 along direction A2. In addition, at least a portion of the second edge 114AE is located within the aforementioned overlapping region.

Figure 3A:
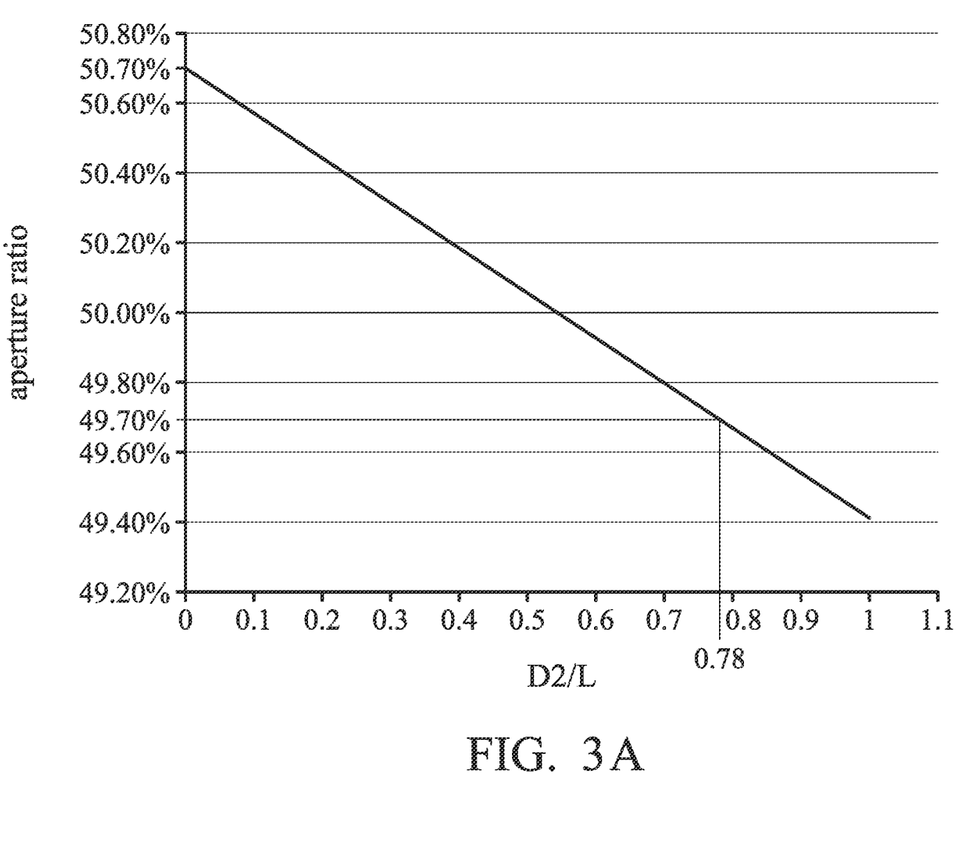
FIG. 3A is a diagram showing the relationship between the length and the aperture ratio of the extending portion of the drain electrode within the overlapping region in accordance with some embodiments of the present disclosure.

FIG. 3A is a diagram showing the relationship between the length of the extending portion of the drain electrode within the overlapping region and the aperture ratio in accordance some embodiments of the present disclosure. As shown in FIG. 3A, the horizontal axis represents the ratio of [the length D2 of the extending portion 114A of the drain electrode 114 along direction A2 within the overlapping region] and [the length L of the curved portion 146B along direction A2]. The vertical axis represents the aperture ratio of the pixel unit 108. It has been shown that when the extending portion 114A of the drain electrode 114 does not overlap the curved portion 146B of the slit 146 (D2/L=0), the aperture ratio of the pixel unit 108 is 50.70%. When D2/L=0.5, the aperture ratio of the pixel unit 108 is 50.05%. When the extending portion 114A of the drain electrode 114 completely shields the curved portion 146B of the slit 146 (D2/L=1), the aperture ratio of the pixel unit 108 is 49.41%.

Moreover, when the aperture ratio is decreased by 1%, D2/L is 0.78, and the aperture ratio is 49.70%. The maximum value of length D2 is the maximum value of length L (4 μm) times 0.78, which is 3.12 μm. As shown in FIG. 2A, the minimum distance D3 between the first edge 116E of the gate electrode 116 and the second edge 114AE of the extending portion 114A along direction A2 is the above length D2 plus distance D1. Therefore, when the aperture ratio is decreased by 1%, the maximum value of distance D3 is the maximum value of the above length D2 (3.12 μm) plus the maximum value of distance D1 (5 μm), which is 8.12 μm or about 8.2 μm.

In addition, the extending line of the second edge 114AE of the extending portion 114A is extending line 117. The length D2 described above is the distance between the extending line 117 and line 115 along direction A2. The distance D3 described above is the distance between the extending line 117 and the extending line 116EA of the first edge 116E along direction A2.

Figure 3B:
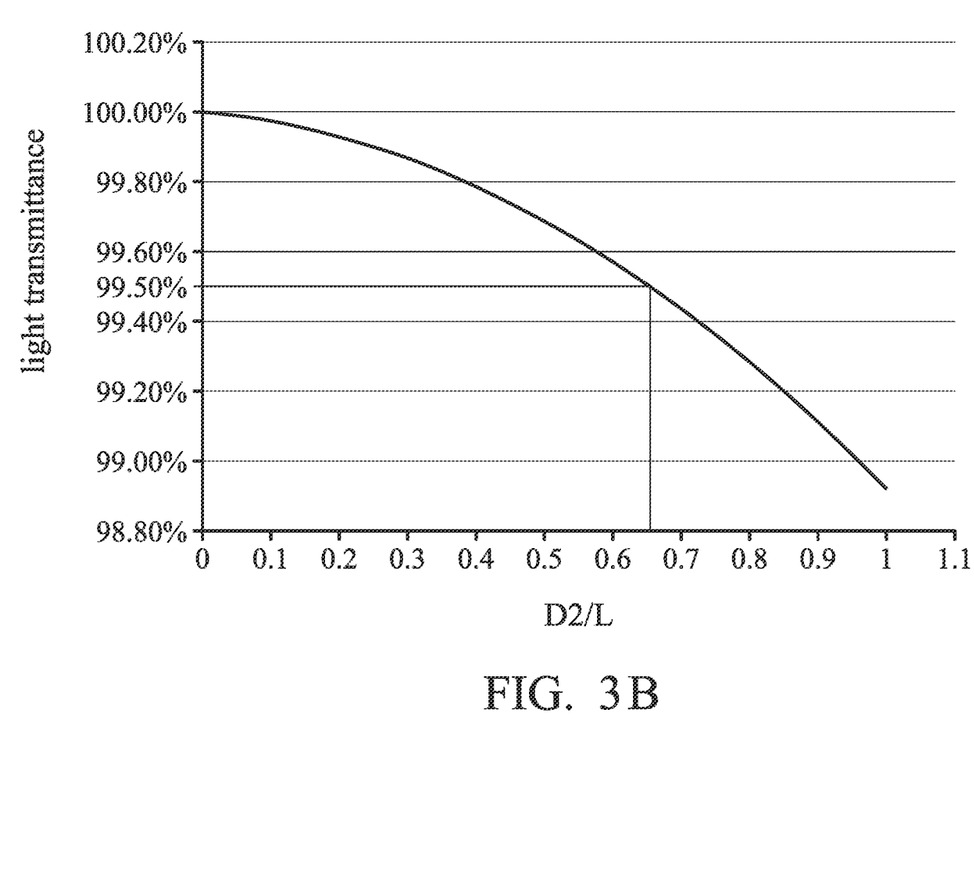
FIG. 3B is a diagram showing the relationship between the length and the light transmittance of the extending portion of the drain electrode within the overlapping region in accordance with some embodiments of the present disclosure.

FIG. 3B is a diagram showing the relationship between the length of the extending portion of the drain electrode within the overlapping region and the light transmittance in accordance with some embodiments of the present disclosure. As shown in FIG. 3B, the horizontal axis represents the ratio of [the length D2 of the extending portion 114A of the drain electrode 114 along direction A2 within the overlapping region] and [the length L of the curved portion 146B along direction A2]. The vertical axis represents the light transmittance of the pixel unit 108. It has been shown that when the extending portion 114A of the drain electrode 114 does not overlap the curved portion 146B of the slit 146 (D2/L=0), the light transmittance of the pixel unit 108 is defined as 100%. When D2/L=0.5, the light transmittance of the pixel unit 108 is 99.69%. When the extending portion 114A of the drain electrode 114 completely shields the curved portion 146B of the slit 146 (D2/L=1), the light transmittance of the pixel unit 108 is 98.92%.

In addition, when the light transmittance is decreased by 0.5%, D2/L is 0.65, and the light transmittance is 99.50%. The maximum value of length D2 is the maximum value of length L (4 μm) times 0.65, which is 2.6 μm. As shown in FIG. 2A, the maximum value of distance D3 between the first edge 116E of the gate electrode 116 and the second edge 114AE of the extending portion 114A along direction A2 is the maximum value of the above length D2 (2.6 μm) plus the maximum value of distance D1 (5 μm), which is about 7.6 μm.

Figure 3C:
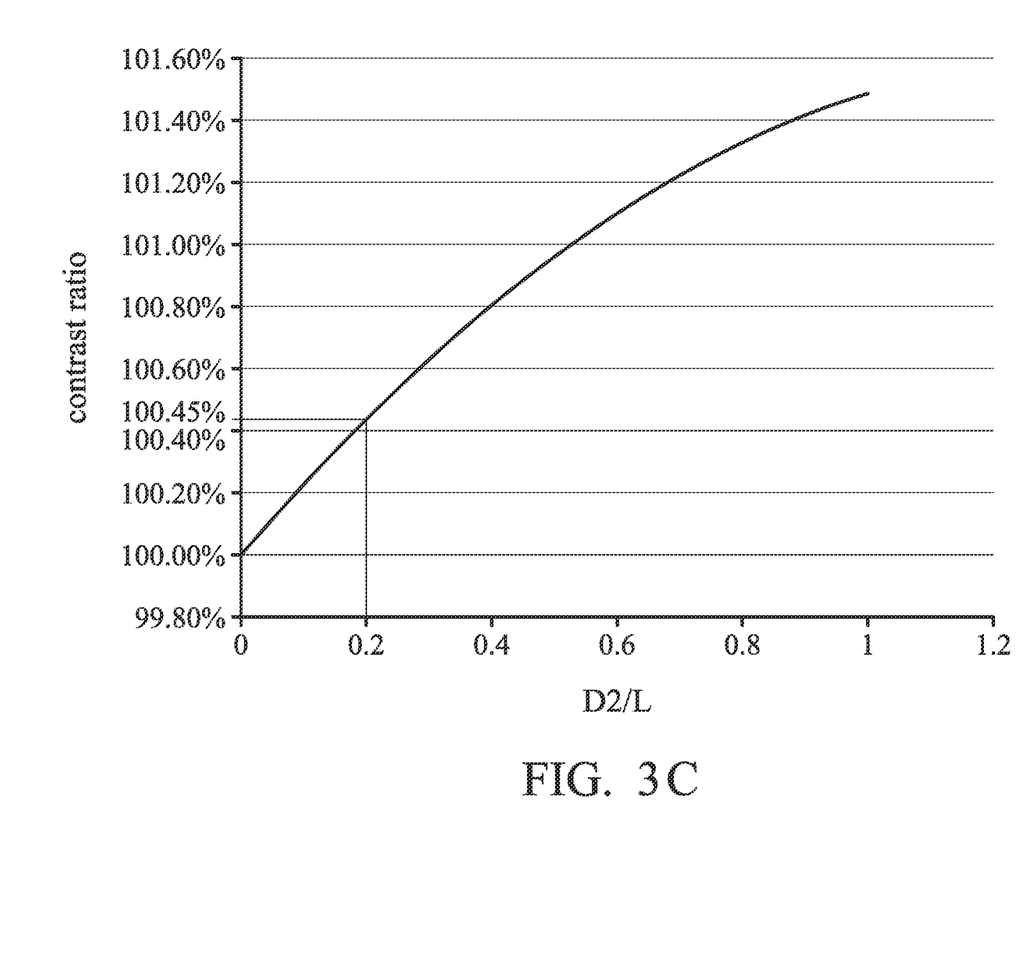
FIG. 3C is a diagram showing the relationship between the length and the contrast ratio of the extending portion of the drain electrode within the overlapping region in accordance with some embodiments of the present disclosure.

FIG. 3C is a diagram showing the relationship between the length of the extending portion of the drain electrode within the overlapping region and the contrast ratio in accordance with some embodiments of the present disclosure. As shown in FIG. 3C, the horizontal axis represents the ratio of [the length D2 of the extending portion 114A of the drain electrode 114 along direction A2 within the overlapping region] and [the length L of the curved portion 146B along direction A2]. The vertical axis represents the contrast ratio of the pixel unit 108. It has been shown that when the extending portion 114A of the drain electrode 114 does not overlap the curved portion 146B of the slit 146 (D2/L=0), the contrast ratio of the pixel unit 108 is defined as 100%. When D2/L=0.5, the contrast ratio of the pixel unit 108 is 100.96%. When the extending portion 114A of the drain electrode 114 completely shields the curved portion 146B of the slit 146 (D2/L=1), the contrast ratio of the pixel unit 108 is 101.49%.

In addition, when the value of D2/L is within a range from 0 to 0.2, the increase of one unit of the D2/L value may increase the contrast ratio the most. When D2/L=0.2, the contrast ratio is 100.45%, and the minimum value of length D2 is the minimum value of length L (2 μm) times 0.2, which is 0.4 μm. As shown in FIG. 2A, the minimum value of distance D3 between the first edge 116E of the gate electrode 116 and the second edge 114AE of the extending portion 114A along direction A2 is the minimum value of the above length D2 (0.4 μm) plus the minimum value of distance D1 (3 μm), which is about 3.4 μm.

Therefore, when the minimum distance D3 between the first edge 116E of the gate electrode 116 and the second edge 114AE of the extending portion 114A along direction A2 is greater than 0 μm and is smaller than 8.2 μm, the contrast ratio of the device is increased while the aperture ratio and the light transmittance are merely decreased a little. In particular, when the minimum distance D3 between the first edge 116E of the gate electrode 116 and the second edge 114AE of the extending portion 114A along direction A2 is greater than 3.4 μm and is smaller than 7.6 μm, the contrast ratio of the device is greatly increased while the aperture ratio and the light transmittance are barely decreased.

Furthermore, when the area of the overlapping region between the extending portion 114A of the drain electrode 114 and the curved portion 146B of the slit 146 is about 0.2 times to about 0.8 times the area of the curved portion 146B, such as being between about 0.3 times and about 0.7 times the area of the curved portion 146B, the contrast ratio of the device is also greatly increased while the aperture ratio and the light transmittance are barely decreased.

Moreover, according to some embodiments, if the distance D3 is greater than 8.2 μm, or the area of the overlapping region is 0.8 times larger than the area of the curved portion 146B, then the aperture ratio and the light transmittance may be decreased excessively.

In accordance with some embodiments of the present disclosure, as shown in FIG. 2A, the minimum width W1 of the extending portion 114A of the drain electrode 114 is greater than the maximum width W2 of the slit 146. As a result, the extending portion 114A of the drain electrode 114 may completely shield light leaks at the curved portion 146B of the slit 146. Thus, the contrast ratio of the device may be increased.

It should be noted that the embodiments shown in FIGS. 1, 2A, 2B, and 2C are merely used for illustration, and the scope of the present application is not intended to be limited to these particular embodiments. Except for the embodiments shown in FIGS. 1, 2A, 2B, and 2C, the common electrode and the pixel electrode of the present disclosure may be arranged in other ways, for example, as per the embodiment shown in FIG. 4. The scope of the present disclosure is not limited to the embodiments of FIGS. 1, 2A, 2B, and 2C.

It should be noted that the same or similar elements or layers in above and below contexts are represented by the same or similar reference numerals. The materials, manufacturing methods and functions of these elements or layers are the same or similar to those described above, and thus will not be repeated herein.

Figure 4:
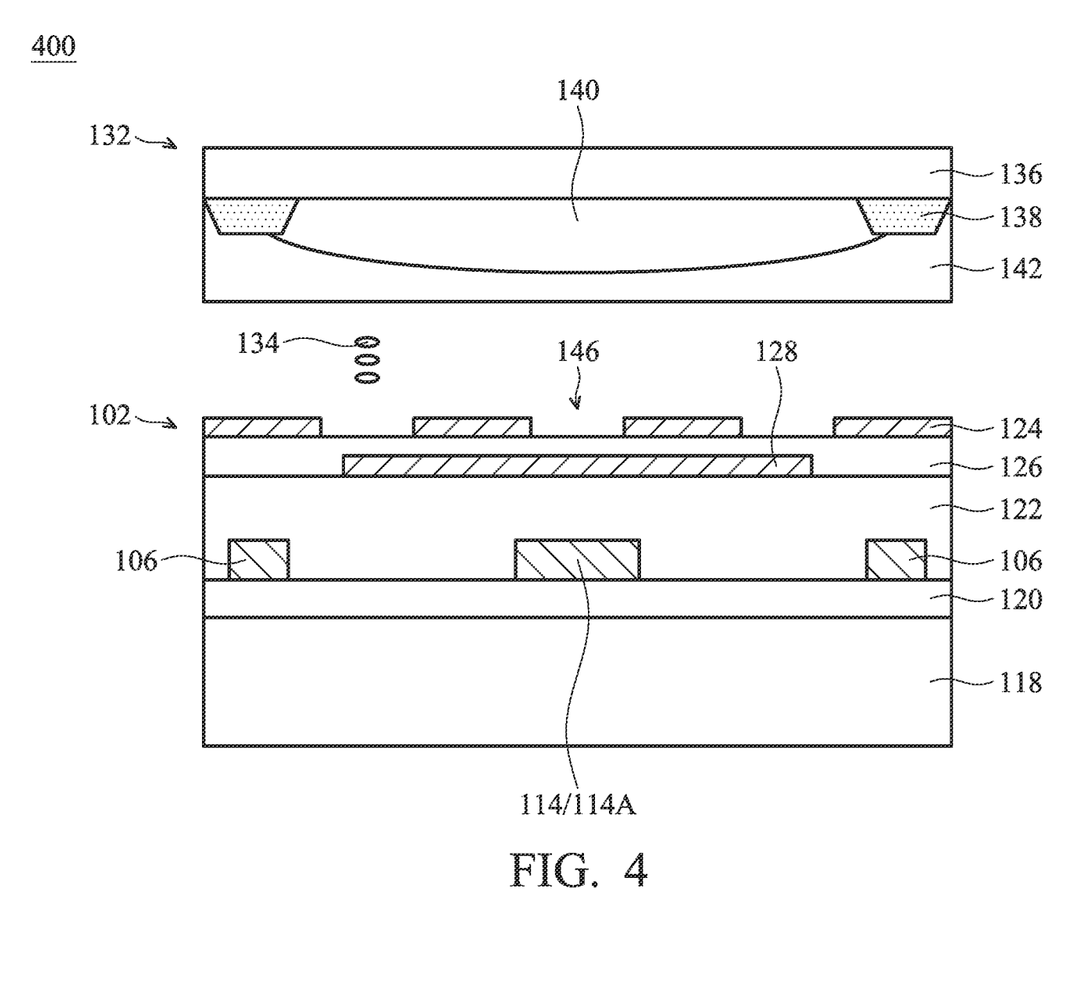
FIG. 4 is a cross-sectional view of the transistor substrate of the display device in accordance with another embodiment of the present disclosure.

FIG. 4 is a cross-sectional view of a display device 400 in accordance with another embodiment of the present disclosure. The difference between the embodiments shown in FIG. 4 and FIG. 2B is that the common electrode 124 is disposed on the pixel electrode 128; the common electrode 124 has the above-mentioned slit 146; and the pixel electrode 128 is disposed between two data lines 106 in accordance with the embodiment of FIG. 4.

It should be noted that the embodiments shown in FIGS. 1, 2A, 2B, and 2C are merely used for illustration, and the scope of the present application is not intended to be limited to these particular embodiments. Except for the embodiments shown in FIGS. 1, 2A, 2B, and 2C, the scan lines of the present disclosure may have other patterns, for example, as in the embodiment shown in FIG. 5. The scope of the present disclosure is not limited to the embodiments of FIGS. 1, 2A, 2B, and 2C.

Figure 5:
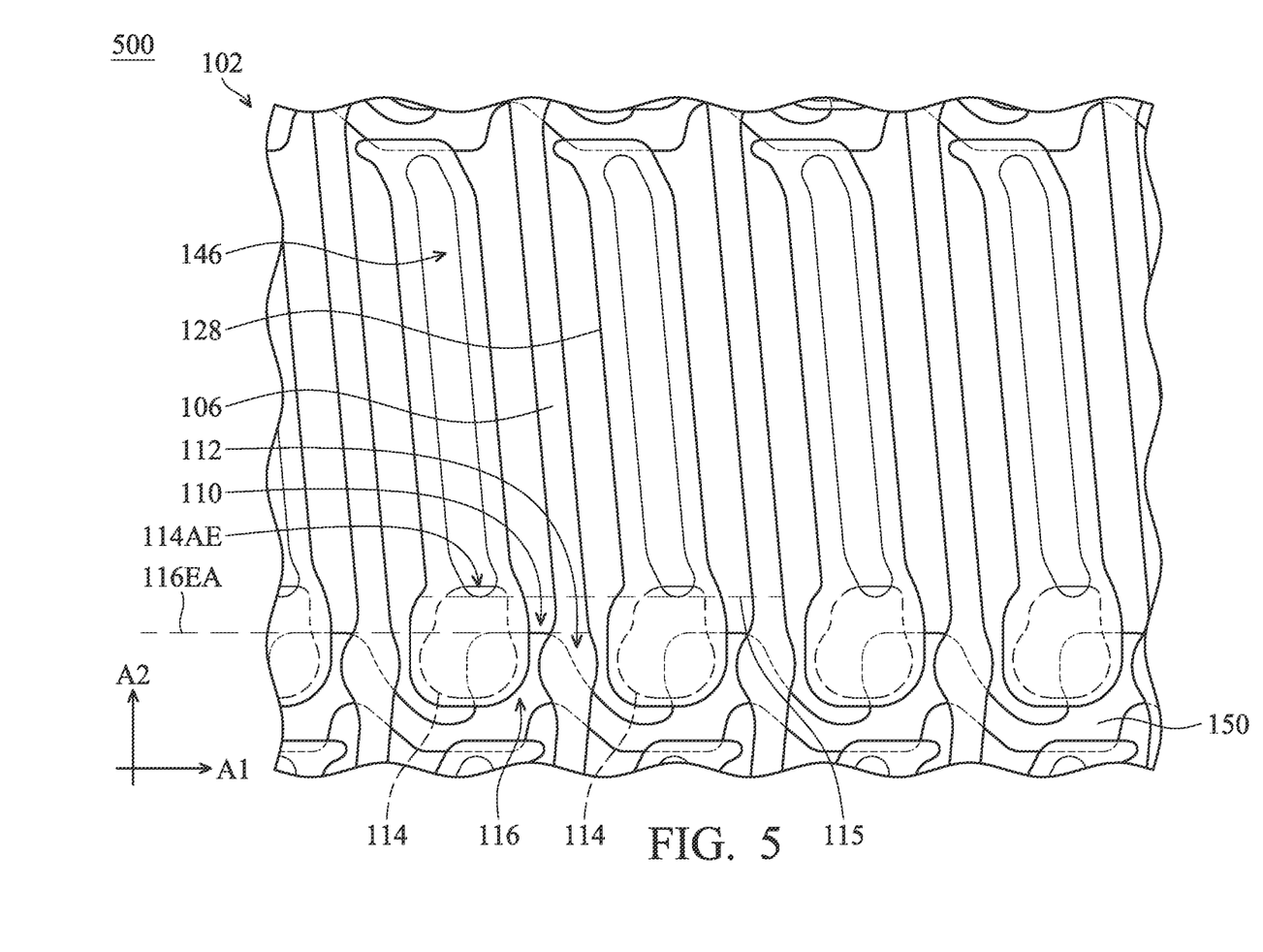
FIG. 5 is a top view of the transistor substrate of the display device in accordance with another embodiment of the present disclosure.

FIG. 5 is a top view of a display device 500 in accordance with another embodiment of the present disclosure. It should be noted that the same or similar elements or layers in above and below contexts are represented by the same or similar reference numerals. The materials, manufacturing methods and functions of these elements or layers are the same or similar to those described above, and thus will not be repeated herein. The difference between the embodiments shown in FIG. 5 and FIG. 2B is that the scan line (gate line) 150 has a curved shape in the embodiment of FIG. 5. However, the scan line (gate line) 150 also extends along direction A1, which is the same as the scan line (gate line) 104 in FIG. 1.

To summarize the above, in accordance with the embodiments of the present disclosure, the drain electrode overlaps the curved portion (or the end portion) of the slit of the pixel electrode or the common electrode so as to shield light leaks of the curved portion. Moreover, in some embodiments, the aperture ratio or the contrast rate of the display device is improved.

In addition, it should be noted that the drain and source mentioned above in the present disclosure are switchable since the definition of the drain and source is related to the voltage connecting thereto.

Note that the above element sizes, element parameters, and element shapes are not limitations of the present disclosure. One of ordinary skill in the art can adjust these settings or values according to different requirements. It should be understood that the transistor substrate and the display device manufactured from the transistor substrate of the present disclosure are not limited to the configurations of FIGS. 1 to 5. The present disclosure may merely include any one or more features of any one or more embodiments of FIGS. 1 to 5. In other words, not all of the features shown in the figures should be implemented in the transistor substrate and the display device manufactured from the transistor substrate of the present disclosure.

Although some embodiments of the present disclosure and their advantages have been described in detail, it should be understood that various changes, substitutions and alterations can be made herein without departing from the spirit and scope of the disclosure as defined by the appended claims. For example, it will be readily understood by one of ordinary skill in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A transistor substrate, comprising:
a plurality of data lines extending along a data extending direction respectively; and
a plurality of scan lines extending along a scan extending direction respectively, the plurality of scan lines intersecting with the plurality of data lines to define a plurality of pixel units, wherein one of the plurality of pixel units comprises:
a first electrode having only one slit, wherein the only one slit is substantially parallel to the plurality of data lines, and the first electrode has a first rounded protruding corner and a second rounded protruding corner near an end portion of the only one slit;
a second electrode, wherein one of the first electrode and the second electrode is used for receiving a pixel voltage signal, and the other one of the first electrode and the second electrode is used for receiving a common voltage signal; and
a switching transistor, comprising:
a gate electrode connecting to one of the plurality of scan lines and comprising a first edge, wherein the first edge is defined as an edge of the gate electrode farthest from the one of the plurality of scan lines along the data extending direction, and an extending line of the first edge is parallel to the scan extending direction; and
a drain electrode electrically connected to one of the first electrode and the second electrode, and comprising an extending portion, wherein the extending portion extends toward the only one slit and extends away from the extending line of the first edge, wherein materials of the data line and the drain electrode are the same, the extending portion comprises a second edge which is defined as an edge of the drain electrode farthest from the one of the plurality of scan lines along the data extending direction, and wherein the extending portion of the drain electrode and a curved portion of the only one slit have an overlapping region;
wherein the only one slit comprises a slit edge which is defined as an edge of the only one slit nearest to the one of the plurality of scan lines along the data extending direction, and the slit edge is located between the extending line of the first edge of the gate electrode and the second edge of the drain electrode in the data extending direction, and
wherein an area of the overlapping region is 0.2 times to 0.8 times an area of the curved portion.

2. The transistor substrate as claimed in claim 1, wherein the second edge is substantially parallel to the first edge, and at least a portion of the second edge is located within the overlapping region, wherein a minimum distance between the first edge and the second edge is greater than 8 μm and is smaller than 8.2 μm.

3. The transistor substrate as claimed in claim 2, wherein the minimum distance between the first edge and the second edge is greater than 3.4 μm and is smaller than 7.6 μm.

4. The transistor substrate as claimed in claim 1, wherein the overlapping region is located within the curved portion.

5. The transistor substrate as claimed in claim 4, wherein the only one slit further comprises a major axis portion connecting to the curved portion, and wherein an absolute value of a slope of an edge of the major axis portion is different from a slope of an edge of the curved portion using the extending direction of the plurality of scan lines as a basis.

6. The transistor substrate as claimed in claim 4, wherein a length of the curved portion along a direction that is perpendicular to the extending direction of the plurality of scan lines is from 2 μm to 4 μm.

7. The transistor substrate as claimed in claim 4, wherein a distance between an end of the curved portion and the first edge of the gate electrode along the direction that is perpendicular to the extending direction of the plurality of scan lines is from 3 μm to 5 μm.

8. The transistor substrate as claimed in claim 1, wherein a minimum width of the extending portion of the drain electrode is greater than a maximum width of the only one slit.

9. A display device, comprising:
a transistor substrate comprising:
a plurality of data lines extending along a data extending direction respectively; and
a plurality of scan lines extending along a scan extending direction respectively, the plurality of scan lines intersecting with the plurality of data lines to define a plurality of pixel units, wherein one of the plurality of pixel units comprises:
a first electrode having only one slit, wherein the only one slit is substantially parallel to the plurality of data lines, and the first electrode has a first rounded protruding corner and a second rounded protruding corner near an end portion of the only one slit;

a second electrode, wherein one of the first electrode and the second electrode is used for receiving a pixel voltage signal, and the other one of the first electrode and the second electrode is used for receiving a common voltage signal; and a switching transistor, comprising:

a gate electrode connecting to one of the plurality of scan lines and comprising a first edge, wherein the first edge is defined as an edge of the gate electrode farthest from the one of the plurality of scan lines along the data extending direction, and an extending line of the first edge is parallel to the scan extending direction; and a drain electrode electrically connected to one of the first electrode and the second electrode, and comprising an extending portion, wherein the extending portion extends toward the only one slit and extends away from the extending line of the first edge, wherein the extending portion comprises a second edge which is defined as an edge of the drain electrode farthest from the one of the plurality of scan lines along the data extending direction, and wherein the extending portion of the drain electrode and a curved portion of the only one slit have an overlapping region;

an opposing substrate disposed opposite to the transistor substrate and comprising a light-shielding layer; and a display medium disposed between the transistor substrate and the opposing substrate;

wherein the light-shielding layer overlaps at least part of the drain electrode;

wherein the only one slit comprises a slit edge which is defined as an edge of the only one slit nearest to the one of the plurality of scan lines along the data extending direction, and the slit edge is located between the extending line of the first edge of the gate electrode and the second edge of the drain electrode in the data extending direction, and wherein an area of the overlapping region is 0.2 times to 0.8 times an area of the curved portion.

10. The display device as claimed in claim 9, wherein the light-shielding layer defines a pixel aperture region, and a portion of the extending portion of the drain electrode is located within the pixel aperture region.

11. A display device, comprising a transistor substrate comprising:

a plurality of data lines extending along a data extending direction respectively; and a plurality of scan lines extending along a scan extending direction respectively, the plurality of scan lines intersecting with the plurality of data lines, wherein two adjacent scan lines and two adjacent data lines define a pixel unit, wherein the pixel unit comprises:

a first electrode having only one slit, wherein the only one slit comprises a curved portion, and the first electrode has a first rounded protruding corner and a second rounded protruding corner near an end portion of the only one slit;

a second electrode disposed corresponding to the first electrode; and a switching transistor, comprising:

a gate electrode electrically connected to one of the plurality of scan lines, wherein the gate electrode comprises a first edge, wherein the first edge is defined as an edge of the gate electrode farthest from the one of the plurality of scan lines along the data extending direction, and an extending line of the first edge is parallel to the scan extending direction; and a drain electrode electrically connected to the first electrode and one of the plurality of the data lines, wherein the drain electrode comprises an extending portion, the extending portion extends away from the extending line of the first edge, wherein the extending portion comprises a second edge which is defined as an edge of the drain electrode farthest from the one of the plurality of scan lines along the data extending direction, and the extending portion of the drain electrode and the curved portion of the only one slit have an overlapping region, wherein the first electrode receives a pixel voltage signal via the drain electrode, and the second electrode receives a common voltage signal;

an opposing substrate disposed opposite to the transistor substrate and comprising a light-shielding layer; and a display medium disposed between the transistor substrate and the opposing substrate;

wherein the light-shielding layer overlaps at least part of the drain electrode;

wherein the only one slit comprises a slit edge which is defined as an edge of the only one slit nearest to the one of the plurality of scan lines along the data extending direction, and the slit edge is located between the extending line of the first edge of the gate electrode and the second edge of the drain electrode in the data extending direction, and wherein an area of the overlapping region is 0.2 times to 0.8 times an area of the curved portion.

* * * * *